United States Patent
Fries et al.

(10) Patent No.: US 9,481,385 B2
(45) Date of Patent: Nov. 1, 2016

(54) SYSTEMS AND METHODS FOR PREDICTIVE MAINTENANCE OF CROSSINGS

(71) Applicant: Alstom Transport Technologies, Saint-Ouen (FR)

(72) Inventors: Jeffrey Michael Fries, Lee's Summit, MO (US); Joseph Forrest Noffsinger, Lee's Summit, MO (US); Richard Lee Lawson, Melbourne Beach, FL (US); Aric Albert Weingartner, Lee's Summit, MO (US); Curtis Doyle Mechling, Fleming Island, FL (US); Aaron Richard Mitti, Atlanta, GA (US); Martin Paget, St. Johns, FL (US); William David Shields, Blue Springs, MO (US)

(73) Assignee: General Electric Company, Schenectady, NY (US)

( * ) Notice: Subject to any disclaimer, the term of this patent is extended or adjusted under 35 U.S.C. 154(b) by 177 days.

(21) Appl. No.: 14/260,338

(22) Filed: Apr. 24, 2014

(65) Prior Publication Data

US 2015/0192636 A1 Jul. 9, 2015

Related U.S. Application Data

(60) Provisional application No. 61/925,338, filed on Jan. 9, 2014.

(51) Int. Cl.
*B61L 29/28* (2006.01)
*B61L 29/30* (2006.01)
(Continued)

(52) U.S. Cl.
CPC .............. *B61L 29/286* (2013.01); *B61L 29/30* (2013.01); *G01R 31/02* (2013.01); *G01R 31/021* (2013.01); *G01R 31/025* (2013.01); *G01R 31/2829* (2013.01); *G01R 31/343* (2013.01)

(58) Field of Classification Search
CPC .. G01R 31/025; G01R 31/02; G01R 31/343; G01R 31/021; G01R 31/2829; B61L 29/286; B61L 29/30
USPC ........................................................ 324/511
See application file for complete search history.

(56) References Cited

U.S. PATENT DOCUMENTS 3,505,742 A    4/1970  Fiechter
3,758,775 A  * 9/1973  Hopkins ............... B61L 29/282
                                                        246/125

(Continued)

FOREIGN PATENT DOCUMENTS

EP    0378781 A1   7/1990
EP    0953491 A1   11/1999
(Continued)

*Primary Examiner* — Jermele M Hollington
*Assistant Examiner* — Christopher McAndrew
(74) *Attorney, Agent, or Firm* — Christopher R. Carroll; The Small Patent Law Group, LLC

(57) ABSTRACT

A method for predicting failure of a crossing warning system is disclosed. The method includes monitoring an electrical characteristic of a first route when an electric current is injected into the first route. The first route has a crossing intersection with a second route and a crossing signal at the crossing intersection. The electrical characteristic is monitored to detect when a vehicle is approaching the crossing intersection on the first route and to determine when to activate the crossing signal at the crossing intersection. The method also includes identifying one or more changes in the electrical characteristic of the first route, and, based on the one or more changes that are identified, predicting a failure mode of the first route that interferes with detection of the vehicle approaching the crossing intersection.

17 Claims, 6 Drawing Sheets

(51) Int. Cl.
  *G01R 31/34* (2006.01)
  *G01R 31/02* (2006.01)
  *G01R 31/28* (2006.01)

(56) References Cited

U.S. PATENT DOCUMENTS

| | | | |
|---|---|---|---|
| 3,864,039 A | 2/1975 | Wilmarth | |
| 4,259,018 A | 3/1981 | Poirier | |
| 4,307,860 A * | 12/1981 | Kuhn | B61L 29/286 246/125 |
| 4,324,376 A * | 4/1982 | Kuhn | B61L 29/284 246/121 |
| 4,490,038 A | 12/1984 | Theurer et al. | |
| 4,581,700 A * | 4/1986 | Farnham | B61L 29/226 246/121 |
| 4,654,973 A | 4/1987 | Worthy | |
| 4,745,262 A * | 5/1988 | Larsen | A47J 27/62 219/492 |
| 4,751,571 A | 6/1988 | Lillquist | |
| 4,783,593 A | 11/1988 | Noble | |
| 4,868,538 A * | 9/1989 | Ballinger | B61L 29/286 246/125 |
| 4,915,504 A | 4/1990 | Thurston | |
| 4,979,392 A * | 12/1990 | Guinon | B61L 23/044 246/121 |
| 5,170,970 A * | 12/1992 | Ballinger | B61L 29/286 246/126 |
| 5,203,089 A | 4/1993 | Trefouel et al. | |
| 5,242,136 A * | 9/1993 | Cribbens | B61L 1/183 246/187 R |
| 5,464,176 A * | 11/1995 | Kruse | B61L 1/183 191/45 R |
| 5,735,492 A * | 4/1998 | Pace | B61L 9/04 246/125 |
| 5,864,304 A * | 1/1999 | Gerszberg | B61L 29/28 246/122 R |
| 5,868,360 A * | 2/1999 | Bader | B61L 29/284 246/202 |
| 5,924,652 A * | 7/1999 | Ballinger | B61L 1/188 246/126 |
| 5,978,718 A | 11/1999 | Kull | |
| 6,011,901 A | 1/2000 | Kirsten | |
| 6,088,635 A | 7/2000 | Cox et al. | |
| 6,128,558 A | 10/2000 | Kernwein | |
| 6,356,299 B1 | 3/2002 | Trosino et al. | |
| 6,532,038 B1 | 3/2003 | Haring et al. | |
| 6,533,222 B1 * | 3/2003 | Brooks | B61L 1/183 246/25 |
| 6,570,497 B2 | 5/2003 | Puckette et al. | |
| 6,600,999 B2 | 7/2003 | Clark et al. | |
| 6,647,891 B2 | 11/2003 | Holmes et al. | |
| 6,778,284 B2 | 8/2004 | Casagrande | |
| 6,800,965 B1 * | 10/2004 | Turner | H01H 1/605 307/128 |
| 6,824,110 B2 | 11/2004 | Kane | |
| 6,995,556 B2 | 2/2006 | Nejikovsky et al. | |
| 7,089,093 B2 | 8/2006 | Lacote | |
| 7,463,348 B2 | 12/2008 | Chung | |
| 7,616,329 B2 | 11/2009 | Villar et al. | |
| 7,845,504 B2 | 12/2010 | Davenport et al. | |
| 7,965,312 B2 | 6/2011 | Chung et al. | |
| 7,966,126 B2 | 6/2011 | Willis | |
| 7,999,848 B2 | 8/2011 | Chew | |
| 8,180,590 B2 | 5/2012 | Szwilski et al. | |
| 8,233,662 B2 | 7/2012 | Bhotika et al. | |
| 8,335,606 B2 | 12/2012 | Mian et al. | |
| 8,405,837 B2 | 3/2013 | Nagle, II et al. | |
| 8,406,940 B2 | 3/2013 | Otsubo | |
| 8,412,393 B2 | 4/2013 | Anderson et al. | |
| 8,599,005 B2 | 12/2013 | Fargas et al. | |
| 8,712,610 B2 | 4/2014 | Kumar | |
| 8,744,196 B2 | 6/2014 | Sharma et al. | |
| 2003/0048193 A1 | 3/2003 | Puckette et al. | |
| 2003/0142297 A1 | 7/2003 | Casagrande | |
| 2005/0018748 A1 | 1/2005 | Ringermacher et al. | |
| 2006/0017911 A1 | 1/2006 | Villar et al. | |
| 2009/0177344 A1 | 7/2009 | James | |
| 2011/0084176 A1 | 4/2011 | Reichelt | |
| 2011/0216200 A1 | 9/2011 | Chung et al. | |
| 2012/0192756 A1 | 8/2012 | Miller et al. | |
| 2012/0300060 A1 | 11/2012 | Farritor | |
| 2013/0191070 A1 | 7/2013 | Kainer et al. | |

FOREIGN PATENT DOCUMENTS

| | | |
|---|---|---|
| EP | 1236634 A1 | 9/2002 |
| EP | 1600351 A1 | 11/2005 |
| WO | 2006112959 A2 | 10/2006 |

* cited by examiner

SYSTEMS AND METHODS FOR PREDICTIVE MAINTENANCE OF CROSSINGS

CROSS-REFERENCE TO RELATED APPLICATIONS

This application claims priority to U.S. Provisional Application No. 61/925,338, which was filed on 9 Jan. 2014, and is titled "Systems and Methods for Predictive Maintenance of Crossings," the entire disclosure of which is incorporated by reference.

FIELD

Embodiments of the subject matter described herein relate to gate crossings, namely, predicting failures associated with the operation of a crossing warning system.

BACKGROUND

A rail vehicle transportation system may include tracks or rails over which rail vehicles travel. These tracks may cross routes of other transportation systems, such as road or highway systems over which automobile and/or pedestrian traffic may pass. To prevent collisions between rail vehicles and automobiles, a crossing warning system having lights and/or lights and crossing gates may be provided at locations where the tracks intersect a road. The crossing warning system is configured to warn automobiles and/or pedestrian traffic of an approaching train.

The crossing warning system may utilize one or more of a variety of techniques to determine when a rail vehicle is approaching. In various embodiments, the crossing warning system uses a track detection circuit that detects the presence of the rail vehicle as it approaches the crossing. However, improper or poor calibration of the track detection circuit may impede performance and accuracy of the ability of the crossing warning system to detect the rail vehicle. Further, the performance and accuracy of the crossing warning system may deteriorate over time. For example, foreign object debris (FOD), such as tree leaves, snow, or materials escaping from rail cars may accumulate on the tracks over time. The FOD may confuse the crossing warning system by fouling the track detection circuit. The FOD and/or the improper calibration may falsely indicate that a vehicle is approaching when no vehicle is present, or fail to provide the desired amount of warning time to automobiles or pedestrian traffic. False predictions are undesirable because of the unnecessary delay caused to motorists, and because the warning times may tempt impatient motorists to drive around crossing gates and/or disregard audible or visible warnings if the motorists do not see any rail vehicles approaching after some period of time. Failing to accurately predict arrival time of an approaching rail vehicle may be undesirable.

Crossing warning systems and track detection circuits are also difficult and costly to maintain. For example, the FOD may require maintenance personnel to visit the crossing and/or a portion of the track surrounding the crossing to clear the FOD. Further, the tracks may require inspection with specialized equipment to locate and/or clear the FOD. Further still, the portion of track may span several miles, thus, increasing the amount of time consumed by the maintenance personnel thereby increasing the cost of operating the crossing.

BRIEF DESCRIPTION

In an embodiment, a method for monitoring a crossing warning system is disclosed. The method includes monitoring an electrical characteristic of a first route when an electric current is injected into the first route. The first route has a crossing intersection with a second route, and a crossing signal at the crossing intersection. The electrical characteristic is monitored to detect when a vehicle is approaching the crossing intersection on the first route, and to determine when to activate the crossing signal at the crossing intersection. The method also includes identifying one or more changes in the electrical characteristic of the first route, and, based on the one or more changes that are identified, predicting a failure mode of the first route that interferes with detection of the vehicle approaching the crossing intersection.

In an embodiment, a crossing warning system includes a crossing controller. As used herein, the terms "system," "controller," and "module" include a hardware and/or software system that operates to perform one or more functions. For example, a system, controller, or module may include one or more hardware circuits or circuitry that include and/or are connected with one or more computer processors, or other logic-based device that performs operations based on instructions stored on a tangible and non-transitory computer readable storage medium, such as a computer memory. Alternatively, a module or system may include a hard-wired device that performs operations based on hard-wired logic of the device. The modules shown in the attached figures may represent the hardware that operates based on software or hardwired instructions, the software that directs hardware to perform the operations, or a combination thereof.

The crossing controller is operably coupled to a crossing signal proximate to a crossing intersection of a first route and a second route. The crossing controller is configured to inject an electric current into the first route. The crossing controller includes a detection module configured to monitor an electrical characteristic of the electric current in the first route to determine when a vehicle is approaching the crossing intersection on the first route, and to determine when to activate the crossing signal. The system includes a failure prediction module configured to identify one or more changes in the electrical characteristic of the first route, and predict a failure mode that interferes with detection of the vehicle approaching the crossing intersection based on the one or more changes identified in the electrical characteristic.

BRIEF DESCRIPTION OF THE DRAWINGS

Reference is now made to the accompanying drawings, in which like numerals represent like parts.

DETAILED DESCRIPTION

Figure 1:
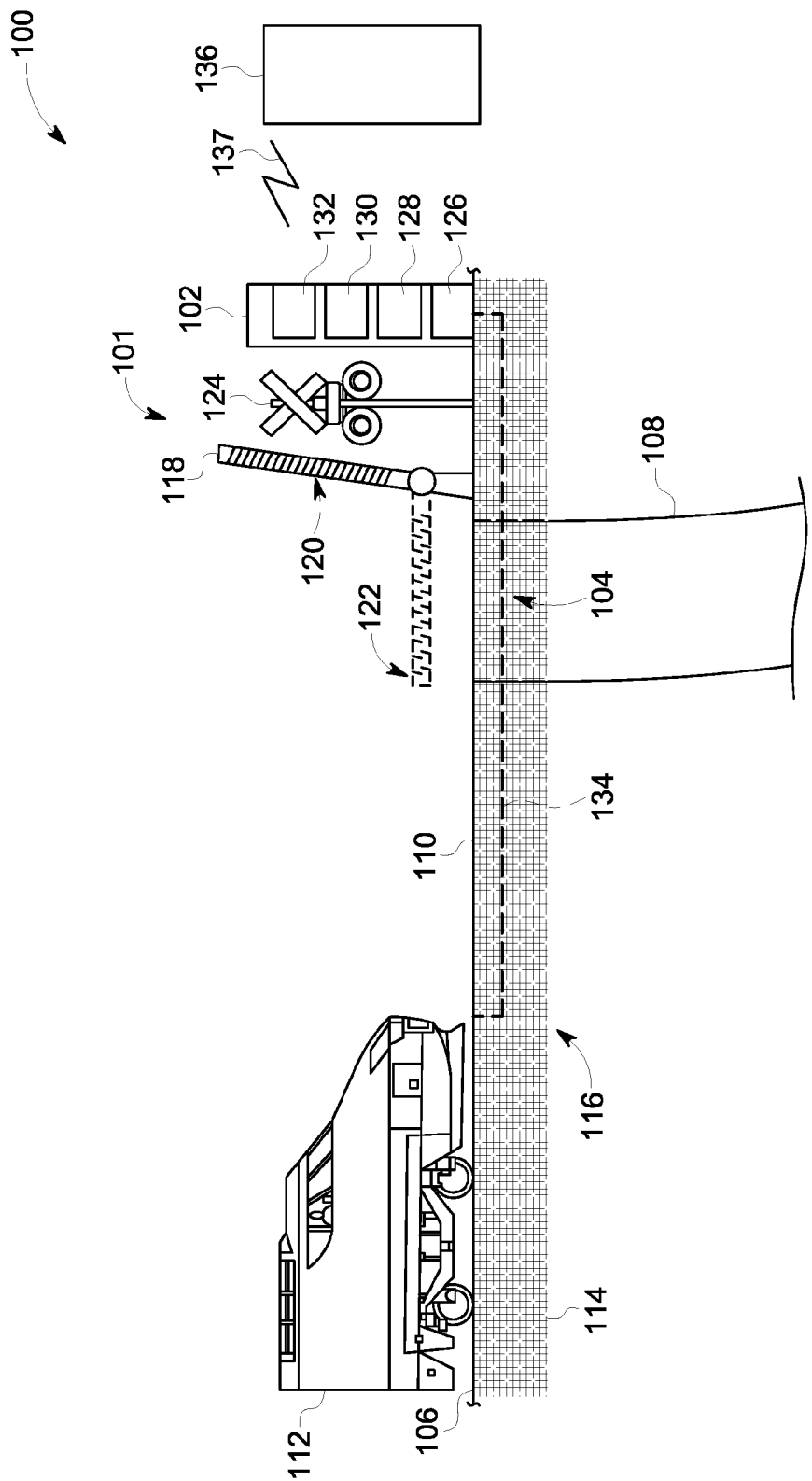
FIG. 1 depicts an elevation view of a schematic diagram of a crossing warning system in accordance with an embodiment.

One or more embodiments of the inventive subject matter described herein provide systems and methods for improved operation of crossings for transportation systems, such as crossings associated with an intersection between a rail system and a road or highway system. In various embodiments, such crossings include a crossing warning system at or near the intersection to provide a warning to vehicles on the road or highway when a rail vehicle is approaching. The crossing warning system may include wayside equipment, such as for example, an automated gate, flashing lights and bells to provide more assertive warning to traffic on the road until the rail vehicle has passed to and through the intersection.

In various embodiments, the crossing warning system includes a crossing controller operably coupled to a crossing signal at a crossing intersection of a first route and a second route. The first route may be a track used by a rail vehicle. The second route may be a road or path used by automobiles. The crossing controller injects an electric current into at least a portion of the first route. A detection module monitors the electrical response of the track to the current to determine when a rail vehicle is approaching the crossing intersection and when to activate the signal.

When a rail vehicle approaches the crossing, the wheels and axle of the rail vehicle create a moving shunt that conductively couples the rails becoming part of a segment of the first route that creates a warning predictor track circuit. The presence, location, and/or speed of the rail vehicle may be determined based on an electrical characteristic sensed by the monitoring module. For example, in an embodiment, the electrical characteristic may be directly proportional to an impedance associated with the circuit. In another embodiment, the electrical characteristic may be inversely related to a phase angle associated with the circuit.

Various embodiments provide improved operation of the crossing warning system by predicting failure of the crossing warning system. For example, by monitoring the electrical characteristics, the crossing warning system may determine a portion of the track is in need of repair. A maintenance operator may then be dispatched to the location of the track identified by the crossing warning system before a failure of the crossing warning system occurs. Optionally, or additionally, the crossing warning system may be remotely repaired without the need for the operator to be dispatched. For example, a software update may be electronically delivered to the crossing warning system. As another example, the crossing warning system may automatically actuate a wheel-rail surface augmentation system (e.g., a contaminant penetrating high voltage system) to remove contaminants that may be present on the tracks. Thus, the crossing warning system may enjoy reduced operation costs and risk.

A technical effect of embodiments includes a reduction in failure of crossings. A technical effect of embodiments includes improved detection of rail vehicles at crossings. A technical effect of embodiments includes reduction of variation in warning times, inconvenience, and/or confusion to motorists or others at a crossing. A technical effect of embodiments is the reduction of temptation to motorists to drive around a closed gate at a crossing, disregard a warning provided at a crossing, or engage in other unsafe behavior. A technical effect of embodiments is the reduction of accidents at crossings. A technical effect of embodiments is the detection of failures of crossing warning systems. A technical effect of embodiments is improved calibration of crossing warning systems.

Throughout this document, the term vehicle consist may be used. A vehicle consist is a group of any number of vehicles that are mechanically coupled to travel together along a route. A vehicle consist may have one or more propulsion-generating units (e.g., vehicles capable of generating propulsive force, which also are referred to as propulsion units) in succession and connected together so as to provide motoring and/or braking capability for the vehicle consist. The propulsion units may be connected together with no other vehicles or cars between the propulsion units. One example of a vehicle consist is a locomotive consist that includes locomotives as the propulsion units. Other vehicles may be used instead of, or in addition to, locomotives to form the vehicle consist. A vehicle consist may also include non-propulsion generating units, such as where two or more propulsion units are connected with each other by a non-propulsion unit, such as a rail car, passenger car, or other vehicle that cannot generate propulsive force to propel the vehicle consist. A larger vehicle consist, such as a train, may have sub-consists. Specifically, there may be a lead consist (of propulsion or non-powered control units), and one or more remote consists (of propulsion or non-powered control units), such as midway in a line of cars and another remote consist at the end of the train. The vehicle consist may have a lead propulsion unit and a trail or remote propulsion unit. The terms "lead," "trail," and "remote" are used to indicate which of the propulsion units control operations of other propulsion units, and which propulsion units are controlled by other propulsion units, regardless of locations within the vehicle consist. For example, a lead propulsion unit may control the operations of the trail or remote propulsion units, even though the lead propulsion unit may or may not be disposed at a front or leading end of the vehicle consist along a direction of travel. A vehicle consist may be configured for distributed power operation, wherein throttle and braking commands are relayed from the lead propulsion unit to the remote propulsion units by a radio link or physical cable. Toward this end, the term vehicle consist should be not be considered a limiting factor when discussing multiple propulsion units within the same vehicle consist.

It should be noted that FIG. 1 is schematic in nature and intended by way of example. In various embodiments, various aspects or modules may be omitted, modified, or added. Further, various modules, systems, or other aspects may be combined. Yet further still, various modules or systems may be separated into sub-modules or sub-systems and/or functionality of a given module or system may be shared between or assigned differently to different modules or systems.

FIG. 1 depicts an elevation view of a schematic diagram of a crossing warning system 100 in accordance with an embodiment. The crossing warning system 100 includes a crossing signal 101 and a crossing controller 102. The crossing signal 101 may be located at or proximate to a crossing intersection 104 between a first route 106 and a second route 108. For example, the crossing signal 101 and the crossing controller 102 may be wayside equipment. The crossing controller 102 may be co-located with the crossing signal 101. For example, the crossing controller 102 may be located adjacent to, or positioned at or proximate to the crossing signal 101. Optionally, the crossing controller 102 may not be co-located with the crossing signal 101. For example, the crossing controller 102 may be located at an offsite location. The first route 106 may include, for example, rails 110 upon which a rail vehicle 112 may travel. The rail vehicle 112 may comprise, a one or more trains forming a consist, as described above. The first route 106 may include ballast 114 forming a track bed 116 to support the rails 110 and railroad ties (not shown) that secure the rails 110 to the track bed 116. The second route 108 may be a road or highway that is paved, leveled, or otherwise configured for automobile and/or pedestrian travel. In some embodiments, the crossing may be understood as a "highway crossing at grade."

The depicted crossing signal 101 is configured to warn traffic travelling to and through the crossing intersection 104 along the second route 108 of a train approaching the crossing intersection 104 along the first route 106 when the crossing signal 101 is activated. The crossing signal 101, when activated, may provide one or more visual cues (e.g., lights), aural cues (e.g., bells), and/or a physical barrier (e.g., a gate). In the illustrated embodiment, the crossing signal 101 includes a mechanically operated gate 118. The gate 118 may be raised to an open position 120 to allow traffic through the crossing intersection 104 along the second route 108, or lowered to a closed position 122 to impede traffic through the crossing intersection 104 along the second route 108. The depicted crossing signal 101 also includes a traffic signal 124. The traffic signal 124 provides a visual and/or aural cue when the crossing warning system 100 is activated. In various embodiments, the traffic signal 124 may include one or more lights, bells, or the like.

In some embodiments, as used herein, impeding travel along a particular route may not present an absolute bar to travel along the route. For example, travel along a route may be impeded by warning against travel through a crossing, discouraging travel through a crossing, blocking travel through a crossing, instructing against travel through a crossing, or otherwise inhibiting travel through a crossing. For instance, the gate 118 may be placed in the closed position 122 to impede the passage of traffic through the crossing intersection 104 along the second route 108; however, a motorist may attempt to evade the gate 118 by driving around the gate 118. Similarly, a motorist may ignore warning bells or lights. Various embodiments provide improved accuracy in detection to reduce the temptation of motorists to evade or ignore a crossing warning.

In the illustrated embodiment, the crossing controller 102 operably coupled to the crossing intersection 104 along the first route 106 along which the rail vehicle 112 is configured to travel. The crossing controller 102 operably coupled to the crossing signal 101 such that the crossing controller 102 may instruct the crossing signal 101 to activate when the rail vehicle 112 is approaching the crossing intersection 104 along the first route 106. When activated, the crossing signal 101 impedes the flow of traffic through the crossing intersection 104 along the second route 108. Similarly, the crossing controller 102 may instruct the crossing signal 101 to deactivate to allow traffic travelling along the second route 108 to enter to and through the crossing intersection 104 when the crossing controller 102 no longer detects vehicles on the first route 106.

The crossing controller 102 of the illustrated embodiment includes a detection module 126, a memory 128, a failure prediction module 130, and a communication module 132. The crossing controller 102 may include other components to support the operation of the various components described herein (e.g. backup power supply, communication devices, antennas, and the like). The detection module 126 is configured to determine when the rail vehicle 112 is approaching or departing the crossing intersection 104 on the first route 106. In response, the detection module 126 may activate or deactivate the crossing signal 101. The detection module 126 is electrically coupled to a track detection circuit 134 to inject an electric current into a portion of the rails 110, and to monitor the response of an electrical characteristic to the electric current to determine when the rail vehicle 112 is approaching or departing, as is described below.

The failure prediction module 130 is configured to identify one or more changes in the electrical characteristic and to predict a failure mode that may interfere with the detection of the rail vehicle 112 by the detection module 126.

The memory 128 is communicably coupled to the failure prediction module 130 to store failure mode information. The memory 128 may also be communicably coupled to other components to store other information. For example, the memory 128 may communicate with the detection module 126 to store a log describing activation times.

The communication module 132 may be communicably coupled to a maintenance center 136 and/or the rail vehicle 112. For example, the communication module 132 may receive messages from and/or may transmit messages to the maintenance center 136 via wireless link 137. The communication module 132 may be communicably coupled to the failure prediction module 130 to exchange failure mode information between the failure prediction module 130 and the maintenance center 136.

Failure mode, as used herein, may refer to an aspect of the first route 106 that meets one or more criteria indicative of potentially causing, and/or a potential cause of, detection interference. As such, a failure mode may be an aspect of the first route 106 that may have been compromised such detection of the rail vehicle 112 may be impaired. The failure mode information may include at least one of the failure modes identified by the failure prediction module 130, and/or remedial actions to be taken by the maintenance center 136 in response to the failure mode. For example, the message may include a failure mode identified as rusty rails 110 and may include a request to resurface the rails 110. It should be noted that FIG. 1 is intended by way of example and is schematic in nature. In various embodiments, various modules (or portions thereof) of the crossing controller 102 may be added, omitted, arranged differently, or joined into a common module, various portions of a module or modules may be separated into other modules or sub-modules and/or be shared with other modules, or the like.

In the illustrated embodiment, the detection module 126 is configured to activate and deactivate the crossing signal 101 in order to impede travel along the second route 108 using information obtained from the track detection circuit 134. The detection module 126 is operably coupled to the track detection circuit 134, and operates the crossing warning system 100 using information from the track detection circuit 134. The detection module 126 is configured to inject an electric current into the track detection circuit 134 and monitor an electrical response of the electric current in the first route to determine when the rail vehicle 112 is approaching the crossing intersection 104. The detection module 126 may activate the crossing signal 101 when presence of the rail vehicle 112 is detected and deactivate the signal crossing 101 when the rail vehicle 112 has travelled passed a predetermined location or is no longer detected. As discussed herein, the track detection circuit 134 may represent a portion of the rails 110 along the first route 106 and may form a closed electrical circuit. The detection module 126 injects an electric current into the tract detection circuit 134, and monitors or receives a signal corresponding to an occupancy or activity on the track. The signal may include one or more electrical characteristics of the electric current, as discussed herein. In some embodiments, the detection module 134 may be configured to provide information corresponding to both a position along the first route 106 and a speed of the rail vehicle 112. In other embodiments, the detection module 134 only determines whether the rail vehicle 112 is present along a predetermined portion of the first route 106 or not. In various embodiments, the crossing controller 102 may operate the crossing signal 101 based on the information received by the detection module 134.

Figure 2:
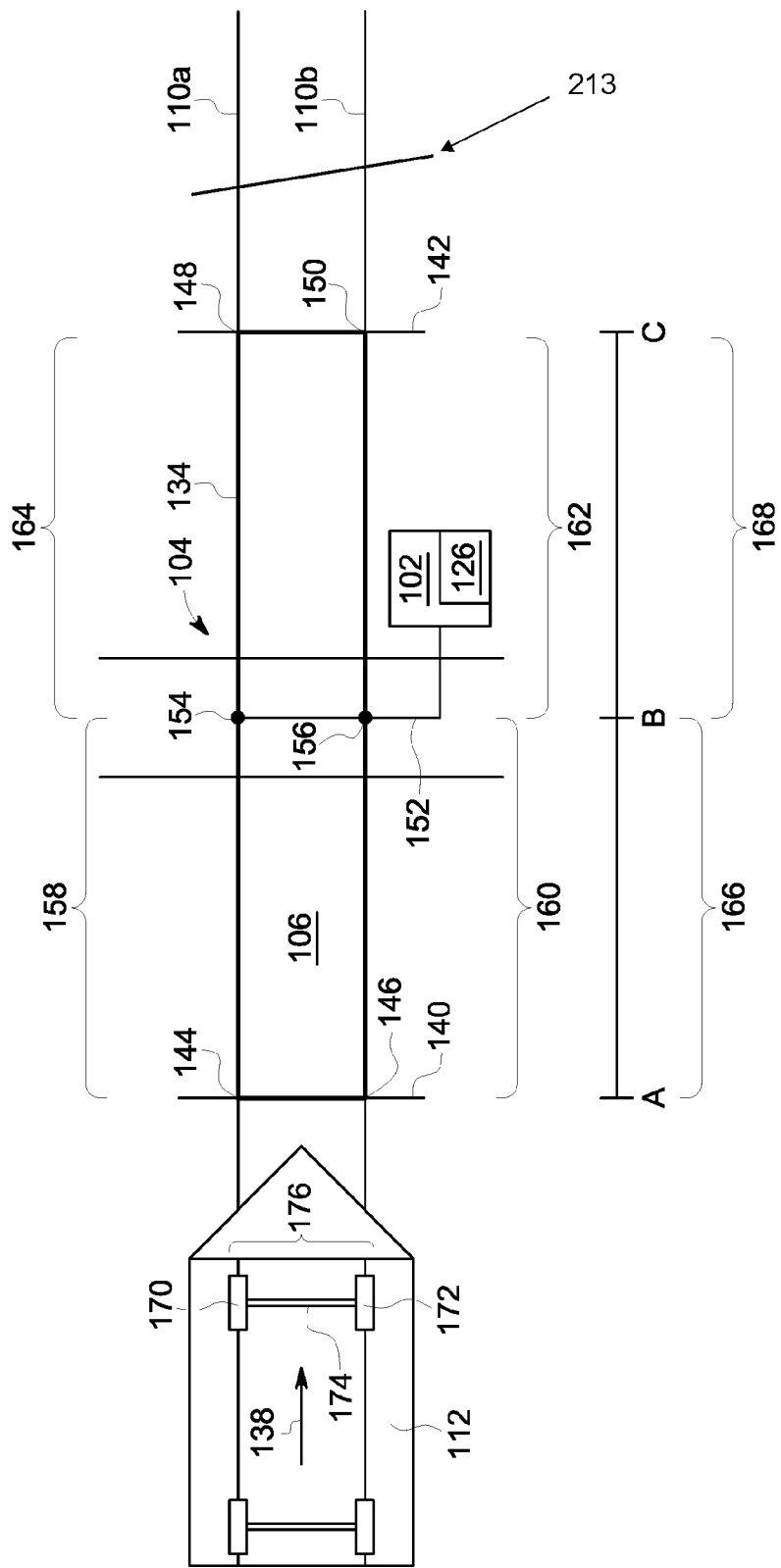
FIG. 2 is an overhead schematic diagram of a warning predictor track circuit in accordance with an embodiment.

FIG. 2 provides an overhead schematic diagram of an embodiment of the track detection circuit 134 formed in accordance with an embodiment. In the illustrated embodiment, the rail vehicle 112 is approaching the crossing intersection 104 along the first route 106 from a first direction 138. In the illustrated embodiment, the rails 110 include plural conductive rails 110a and 110b along the first route 106 on which the rail vehicle 112 travels. The track detection circuit 134 may represent a closed loop electrical circuit. The detection circuit 134 may be used to detect the presence of the rail vehicle 112 when the rail vehicle 112 enters a portion of the track defined by the closed loop. The track detection circuit 134 includes a portion of the rails 110a and 110b. The track detection circuit 134 may also include one or more fixed shunts 140 and 142 that electrically complete the track detection circuit 134 when no rail vehicles are present. The fixed shunts 140 and 142 may be electrically conductive shunts buried beneath the rails 110 (e.g., within the ballast 114 (shown in FIG. 1)) that electrically connects rail 110a to rail 110b. For example, the fixed shunt 140 includes a first end 144 that forms an electrical connection with the rail 110a, and a second end 146 that forms an electrical connection with the rail 110b. Similarly, the fixed shunt 142 includes a first end 148 that forms an electrical connection with the rail 110a and a second end 150 that forms an electrical connection with the rail 110b. As discussed below, one or more foreign object shunts 213 that are electrically conductive and electrically connect rail 110a to rail 110b.

The track detection circuit 134 may include wiring 152 located at or proximate to the crossing controller 102. The wiring 152 may electrically connect to the rail 110a at a first end 154, and electrically connect to the rail 110b at a second end 156. The wiring 152 may also be electrically connected to the detection module 126 such that the detection module 126 may inject an electric current to and through the wiring 152 into the rails 110.

The wiring 152 may complete the track detection circuit 134 to energize a portion of the track detection circuit 134. For example, the track detection circuit 134 may comprise the wiring 152, a portion 158 of the rail 110a between the first end 154 of the wiring 152 and the first end 144 of the fixed shunt 140, the fixed shunt 140, and a portion 160 of the rail 110b between the second end 146 of the fixed shunt 140 and the second end 156 of the wiring 152. Similarly, the track detection circuit 134 may also include the wiring 152, a portion 162 of the rail 110b between the second end 156 of the wiring 152 and the second end 150 of the shunt 142, the shunt 142, and a portion 164 of the rail 110a between the first end 148 of the shunt 142 and the first end 154 of the wiring 152.

In the illustrated embodiment, the fixed shunt 140 is located at a position A along the first route 106. The wiring 152 may be electrically connected to the rails 110 at a position B along the first route 106. In some embodiments, the position B is within the crossing intersection 104. The fixed shunt 142 is located at a position C along the first route 106. In various embodiments, the track detection circuit 134 may include more or fewer fixed shunts, such as the fixed shunts 140 and 142. Additionally or optionally, the fixed shunts may be equally spaced apart. For example, the distance between the fixed shunt 140 and the wiring 152 may define an approach range 166. The distance between the fixed shunt 142 and the wiring 152 may define an egress range 168 (e.g., departure range). The approach range 166 and the egress range 168 may be substantially similar such that the wiring 152 may be approximately near a midpoint between the fixed shunt 140 and the fixed shunt 142.

The rail vehicle 112 includes electrically conductive wheels 170 and 172 joined by an electrically conductive axle 174. The wheels 170, 172 travel on the rails 110a and 110b, respectively. The wheels 170 and 172 and axle 174 form an electrical connection with the rails 110, such that the wheels 170 and 172 create a moving shunt 176 between rails 110a and 110b as the rail vehicle 112 travels along the first route 106. In various embodiments, the rail vehicle 112 may include a plurality of moving shunts 176. As discussed below, various electrical characteristics of the track detection circuit 134 change in response to the presence and movement of the moving shunt 176. Based on one or more of the electrical characteristics, the detection module 126 may determine the location of the moving shunt 176 within the track prediction circuit 134. Additionally, the detection module 126 may time the movement of the moving shunt 176 to estimate the speed of the rail vehicle 112 and predicted arrival time at the crossing intersection 104.

The crossing controller 102 may determine when to activate (or de-activate) the crossing signal 101 in certain respects generally similar to the discussion herein regarding the embodiment depicted in FIG. 1. For example, detection module 126 may inject a current into the track detection circuit 134 and monitor an electrical characteristic, as described below. When the moving shunt 176 enters the approach range 166, the detection module 126 may sense the presence of the moving shunt 176, and hence the rail vehicle 112. In response, the crossing controller 102 may activate the crossing signal 101. When the rail vehicle 112 travels outside of the egress range 168 or has travelled passed a predetermined location, the crossing controller 102 may deactivate the crossing signal 101. In the illustrated embodiment, the rail vehicle 112 is travelling in the direction 138. However, the rail vehicle 112 may also travel in a direction opposite to the direction 138, resulting in the crossing signal 101 being activated when the rail vehicle 112 enters the egress range 168 and deactivated when the rail vehicle exits approach range 166.

Figure 3:
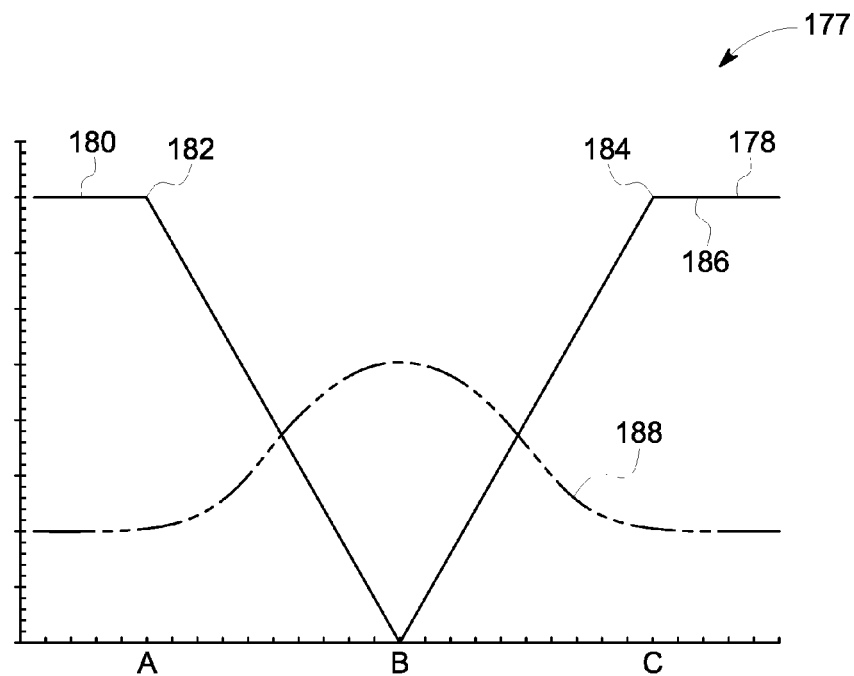
FIG. 3 is a graph showing an ideal electrical characteristic responsive to a vehicle approaching, entering, and passing through a crossing intersection in accordance with an embodiment.

FIG. 3 is a graph 177 showing an ideal electrical characteristic responsive to the vehicle 112 (shown in FIGS. 1 and 2) approaching, entering, and passing through the crossing intersection 104 (shown in FIGS. 1 and 2) in accordance with an embodiment. The detection module 126 (shown in FIGS. 1 and 2) may inject an electric current into the first route 106 (shown in FIGS. 1 and 2) and monitor an electrical response to estimate the location of the rail vehicle 112 along the first route 106. The electric current may be in the form of direct current (DC) or alternating current (AC), such as, for example, phase shifted alternating current. The electrical characteristic may include at least one of an electrical impedance, a phase of the electric current that is injected into the first route 106, or a combination of the electrical impedance and the phase of the electric current. For example, the electrical characteristic may be proportional to the electrical impedance and inversely related to the phase.

In the illustrated embodiment, electrical characteristic curve 178 represents the change in electrical characteristic sensed by the detection module 126 as the rail vehicle 112 approaches, enters, and passes through the crossing intersection 104. The electrical characteristic curve 178 may maintain an initial steady state 180 value preceding an inflection point 182. The initial steady state 180 value may represent the electrical characteristic when the rail vehicle 112 has not entered the approach range 166. The inflection point 182 may represent the point A along the first route 106, as discussed above in relation to FIG. 2. Inflection points, as described herein, represent a change in concavity or slope of an electrical characteristic curve. The electrical characteristic curve 178 may decline substantially linearly from the point A to the point B as the moving shunt 176, and hence the rail vehicle 112, enters the approach range 166 and becomes part of the track detection circuit 134. The point B may represent the location where the wiring 152 electrically connects with the rails 110. Similarly, the impedance curve 178 may increase substantially linearly from the point B to inflection point 184 as the moving shunt 176 travels to and through the egress range 168. The inflection point 184 may represent the point C. The impedance curve 178 may approach an egress steady state 186 value beyond the inflection point 184. In various embodiments, the egress steady state value 184 may be approximately the same as the approach steady state value 180. Accordingly, the detection module 126 may determine the location, speed, and arrival time of the rail vehicle 112 at the crossing intersection 104 based on the electrical characteristic curve 176.

The detection module 126 may analyze the electrical characteristics to determine when to activate and deactivate the crossing signal 101. For example, detection module 126 may detect the presence of the rail vehicle 112 at point A by monitoring the electrical characteristic for the inflection point 182, and through the approach range 166. The detection module 126 may then activate the crossing signal 101, as discussed above in relation to FIG. 1, to impede the flow of traffic along the second route 108 through the crossing intersection 104. Similarly, the detection module 126 may monitor the electrical characteristic for the inflection point 184 at point C to determine that the rail vehicle 112 has exited the egress range 168. The detection module 126 may deactivate the crossing signal 101 to allow traffic along the second route 108 to travel through the crossing intersection 104 after outbound motion of the rail vehicle 112 is detected. For example, in various embodiments, the detection module 126 may deactivate the cross signal 101 after the rail vehicle has travelled passed through the crossing intersection 104 at point B.

In various embodiments, the electrical characteristic may include a phase of the electric current injected into the first route 106. In the illustrated embodiment the phase curve 188 may represent the response of the electrical phase to the moving shunt 176, and hence the rail vehicle 112. It should be noted the detection module 126 may use the phase curve 188, the electrical characteristic curve 178, and/or the like to determine the location of the rail vehicle 112.

In various embodiments, the failure prediction module 130 (shown in FIG. 1) is configured to identify one or more changes in the electrical characteristic of the first route 106, and predict a failure mode that interferes with the detection of the rail vehicle 112 approaching the crossing intersection 104 based on one or more changes in the electrical characteristic. For example, the electrical characteristic curve 178 may deviate from the ideal curve depicted in the illustrated embodiment. The deviations may impede detection of the inflection points 182 and/or 184 and may confuse the detection module 126, such that the detection module 126 may falsely indicate that a rail vehicle 112 is approaching, when no rail vehicle 112 is present. Accordingly, the detection module 126 may activate the crossing signal 101, even though no rail vehicle 112 is travelling on the first route 106. This may create delays for vehicles travelling on the second route 108 and may temp impatient motorists to drive around the crossing gate 118 creating an unsafe condition. Similarly, the deviations in the electrical characteristic may delay detection of the rail vehicle 112. The delay may reduce the amount of time the crossing signal 101 has to block the crossing intersection 104 along the second route 108. Accordingly, motorists may not stop in time resulting in a collision and/or injury to the motorists.

The failure prediction module 130 may be communicably coupled to the detection module 126 such that the failure prediction module 130 may identify one or more changes of the electrical characteristic to predict a failure mode that interferes with detection of the rail vehicle 112 when the rail vehicle 112 is approaching the crossing intersection 104.

Figure 4:
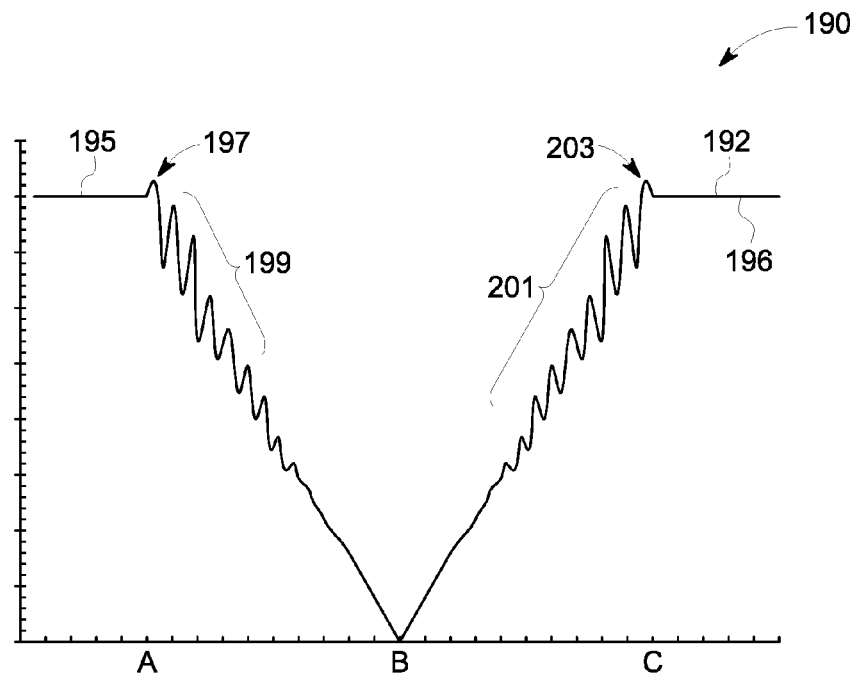
FIG. 4 is a graph showing an electrical characteristic having a noisy response to a vehicle entering a crossing intersection in accordance with an embodiment.

FIG. 4 is a graph 190 showing an electrical characteristic having a noisy response to the rail vehicle 112 (shown in FIGS. 1 and 2) entering the crossing intersection 104 (shown in FIGS. 1 and 2) in accordance with an embodiment. The graph 190 shows electrical characteristic curve 192 having a noisy response to the rail vehicle 112 that may be identified by the failure prediction module 130 (shown in FIG. 1). The electrical characteristic curve 192 represents the change in electrical characteristic sensed by the detection module 126 (shown in FIG. 1) as the rail vehicle 112 approaches the crossing intersection 104. The electrical characteristic curve 192 may maintain an approach steady state 195 value preceding point A, and an egress steady state value 196 after point C. The electrical characteristic curve 192 may exhibit a noisy region 199 indicative of a change in at least one of an amplitude or a variance in noise after the rail vehicle enters the track detection circuit 134 indicated by the inflection point 197 (e.g., no noise is present before the rail vehicle 112 enters point A). The noise region 199 may impede detection of the inflection point 197. The noise region 199 may delay and/or inhibit detection of the rail vehicle 112 anywhere between point A and point B. Accordingly, the detection module 126 may fail to detect the presence of the rail vehicle 112 and/or may lead to a delay or failure of the detection module 126 to activate the crossing signal 101 at a proper time. The amplitude or variance of noise in the electrical characteristic curve 192 is larger when the rail vehicle 112 is at locations along the first route 106 that are further from the crossing intersection 104 than when the rail vehicle 112 is at location along the first route 106 that are closer to the crossing intersection 104. For example, as the rail vehicle 112 approaches point B, the amplitude of the noise may decrease such that more noise having greater amplitude is exhibited at point A. Similarly, noisy region 201 may exhibit an increase in at least one of the amplitude or the variance as the rail vehicle 112 approaches point C. The noisy region 201 may inhibit detection of inflection point 203 which the detection module 126 may use to determine that the rail vehicle 112 has travelled passed point C. Accordingly, the noisy region 201 may prematurely deactivate the crossing signal 101, or may prolong activation of the crossing signal 101.

The failure prediction module 130 may predict a failure mode based on the electrical characteristic curve 192 as a deterioration of a route-to-wheel interface between the first route 106 and one or more wheels 170 and 172. The route-to-wheel interface may include the situation of the wheels 170 and 172 on the rails 110a and 110b. The failure prediction module 130 may identify the failure mode as one caused by rusty rails 110. For example, rust may develop on the surface of the rails 110 that contacts the wheels 170 and 172 creating electrical interference that may be exhibited as the noise in the electrical characteristic curve 192. Alternatively, the failure prediction module 130 may identify the failure mode as noise caused changes in the shunting value of the axle 174 (e.g., change in impedance due to vibration).

The failure prediction module 130 may be communicably coupled to the communication module 132. The communication module 132 may transmit failure mode information to the maintenance center 136 to take remedial action. Remedial action may include, removal of rust from the rail 110, inspection of the wheels 170 and 172 and axle 174 of the rail vehicle 112. Optionally, the maintenance center 136 may dispatch a maintainer to inspect and clean the rail 110. As another option, all rail vehicles 112 entering the crossing intersection 104 could be notified to take precaution through the crossing intersection 104 until the failure has been remedied. As another option, a wheel-rail surface augmentation system (e.g., a contaminant penetrating high voltage system) may be automatically actuated.

Figure 5:
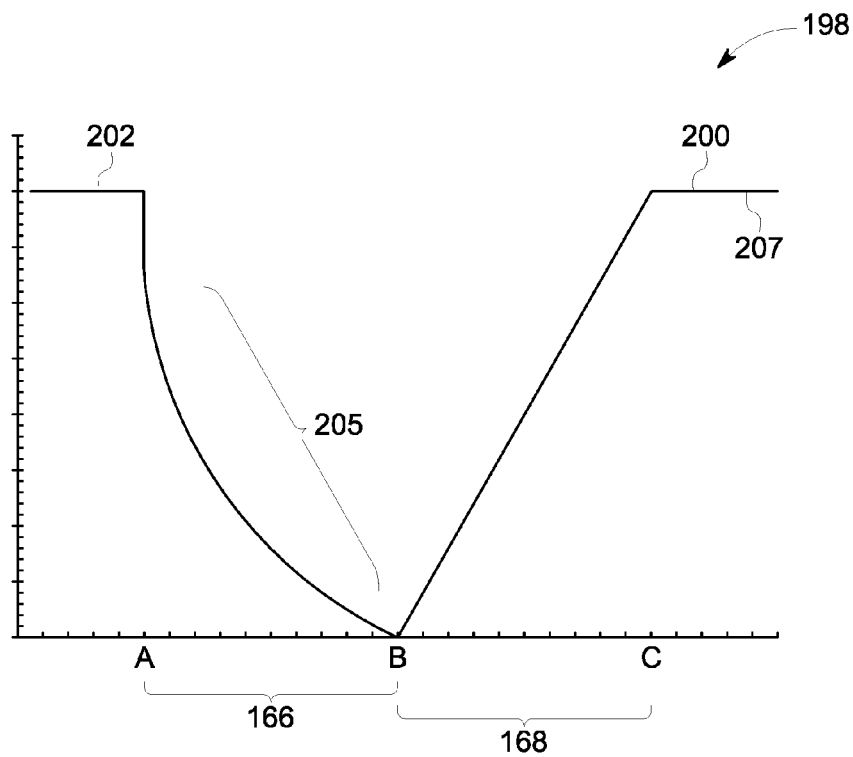
FIG. 5 is a graph showing an electrical characteristic curve having a non-linear response to a rail vehicle entering the crossing intersection in accordance with an embodiment.

FIG. 5 is a graph 198 showing an electrical characteristic curve 200 having a non-linear response to the rail vehicle 112 (shown in FIGS. 1 and 2) entering the crossing intersection 104 (shown in FIGS. 1 and 2) in accordance with an embodiment. The electrical characteristic curve 200 may maintain an approach steady state 202 value preceding point A, and may maintain an egress steady state value 207 after point B. The electrical characteristic curve 200 may exhibit a non-linearity, indicated by non-linear region 205, in the approach range 166 between point A and point B. The electrical characteristic curve 200 may exhibit a linear response (e.g., ideal) in the egress range 168 between point B and point C.

The failure prediction module 130 may identify the non-linearity in the electrical characteristic at different locations along the first route 106. For example, in the illustrated embodiment, the failure prediction module 130 may identify the non-linear region 205 in the approaching range 166, and the egress range 168 having a nearly linear response. The failure prediction module 130 may detect the non-linear region 205 to determine a failure mode of at least one of a poor shunt, a track short, or an improper calibration.

Maintenance of the crossing warning system 100 may include calibration of the detection module 126 and/or the track detection circuit 134. The rails 110a and 110b may have an impedance based on the length of track in the approach range 166 and the egress range 168. For example, the rails 110a and 110b may be assumed to have a certain impedance per unit length. The impedance may then be based on the length of the ranges 166, 168. However, if the ranges 166 and 168 are not properly calibrated and/or measured, the expected impedance may not coincide with the impedance measured by the detection module 126, resulting in a non-linear electrical characteristic. Improper calibration may impede accurate detection of the rail vehicle 112 by the detection module 126. For example, a calibration shunt (not shown) may be placed at different locations (e.g., the point A, B, and/or C) between the rails 110 along the first route 106 to calibrate the detection module 126 and the track detection circuit 134. The calibration shunt may provide a predetermined impedance between the rails 110 as the calibration shunt is moved through the crossing intersection 104. Accordingly, the detection module 126 may be calibrated by comparing the impedance measured by the detection module 126 and the predetermined impedance as the calibration shunt is moved to and through the predetermined locations along the first route 106.

The failure prediction module 130 may compare the linearity of the approach range 166 to the egress range 168 to determine whether calibration is required. The failure prediction module 130 may communicate with the maintenance center 136 to take one or more remedial actions.

Additionally or alternatively, the non-linear region 205 may indicate a discontinuity in the rails 110. For example, the rails 110 may develop a crack or may become disjoined from the track bed 116 (e.g., become warped). Additionally, the non-linear region 205 may indicate a change in the ballast 114. The ballast 114 is electrically neutral (e.g., an electrical insulator). However, the amount of ballast 114 material may deteriorate or become contaminated with conductive pollutants over time, thus the track bed 116 may become slightly conductive resulting in an artificial shunt being created across the rails 110.

The failure prediction module 130 may send failure information to the maintenance center 136 via the communication module 132 to take remedial action. Remedial action may include re-calibrating the portion of rails 110 that exhibits the non-linear electrical characteristic. Additionally, remedial action may include adding or maintaining the ballast 114.

Figure 6:
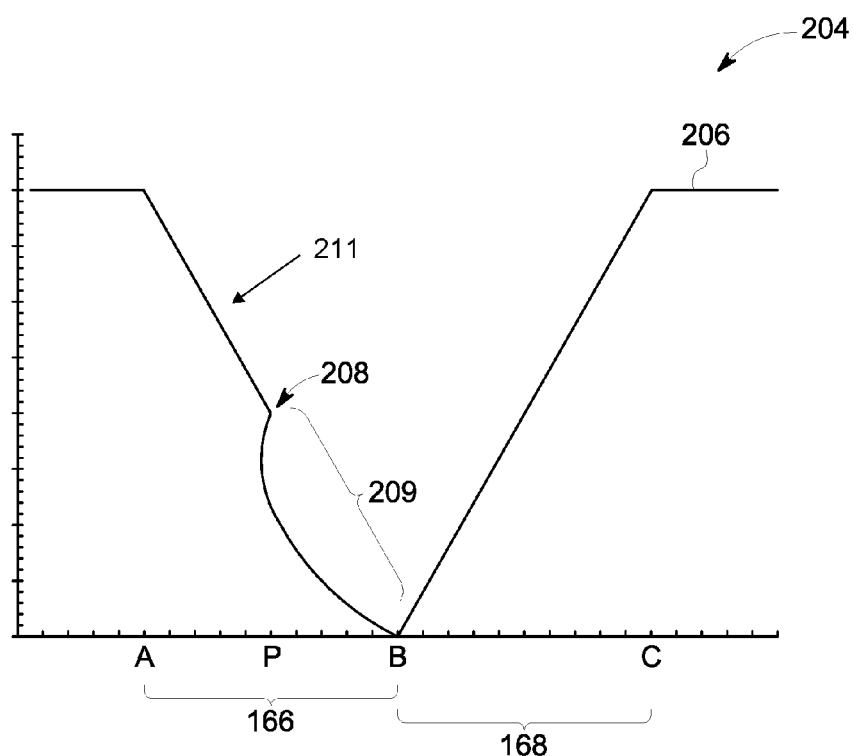
FIG. 6 is a graph showing an electrical characteristic curve having a partial non-linear response to a rail vehicle entering the crossing intersection 104 in accordance with an embodiment.

FIG. 6 is a graph 204 showing an electrical characteristic curve 206 having a partial non-linear response to the rail vehicle 112 entering the crossing intersection 104 in accordance with an embodiment. In the illustrated embodiment, the electrical characteristic curve 206 maintains an ideal response having a linear portion 211 up to an inflection point 208 in the approach range 166. The electrical characteristic curve 206 exhibits a non-linear response in the non-linear region 209 between the inflection point 208 and the point B. The response in the egress range 168 may be ideal.

The failure prediction module 130 may identify the location P along the rails 110 corresponding to the inflection point 208. The failure prediction module 130 may identify the failure mode associated with the non-linear region 209 as a track short. For example, FOD may create a foreign object shunt 213 (shown in FIG. 2) that electrically couples rail 110a to rail 110b. The foreign object shunt 213 may result in an electrical short and may be exhibited by the non-linearity in the electrical characteristic. For example, FOD may include a metallic object, such as a metal band that may contact the rails 110*a* and 110*b* creating a shunt. As another example, a bicycle may be placed over the rails 110*a* and 110*b* creating a shunt. As another example, a chain may be placed over the rails 110*a* and 110*b* creating a shunt.

The failure prediction module 130 may transmit failure mode information to the maintenance center 136 to take remedial action. Remedial action may include removal of FOD from the rails 110, inspection of the rails 110, and/or the like. The failure mode information may include the estimated location of the FOD, indicated by point P.

Figure 7:
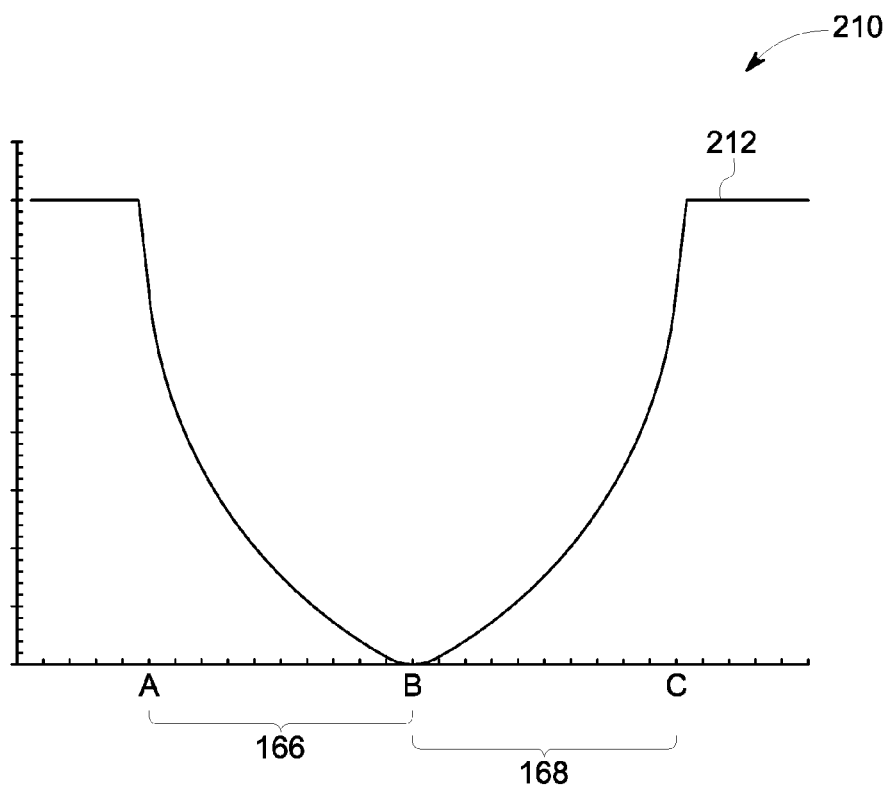
FIG. 7 is a graph showing an electrical characteristic curve having a non-linear response to a rail vehicle entering and leaving the crossing intersection in accordance with an embodiment.

FIG. 7 is a graph 210 showing an electrical characteristic curve 212 having a non-linear response to a rail vehicle 112 entering and leaving the crossing intersection 104 in accordance with an embodiment. The electrical characteristic curve 212 may exhibit a non-linear response in the approach range 166 in addition to the egress range 168. The failure prediction module 130 may identify the failure mode as poor shunting or a failure with the moving shunt 176. The failure prediction module 130 may compare the electrical characteristic curve 212 in the approach range 166 and the egress range 168. If the electrical characteristic curve 212 exhibits a non-linear behavior in both regions, the failure prediction module 130 may identify the failure mode as a high value train shunt. A high value train shunt may exhibit an impedance that is greater than the ideal impedance of the moving shunt 176 and may indicate a problem with the axle 174. Additionally, the curve 212 exhibits a non-linear region in both the approach range 166 and the egress range 168, indicating the failure mode may be associated with the rail vehicle 112 (e.g., not the rails 110). In response, the failure prediction module 130 may communicate the failure mode information to the rail vehicle 112 and/or the maintenance center 136.

Figure 8:
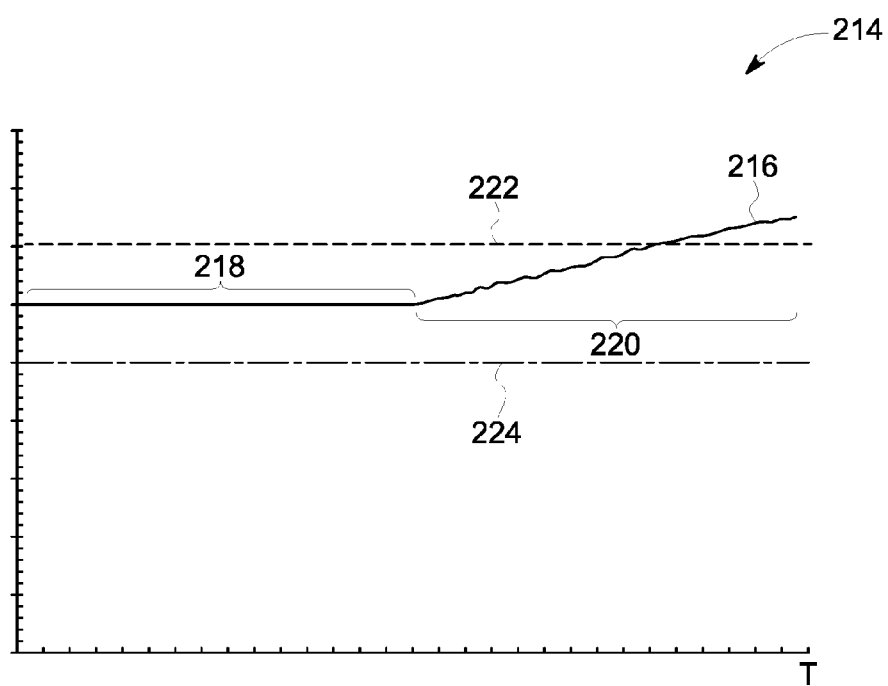
FIG. 8 is a graph showing a response of an electrical characteristic curve plotted over time that is indicative of a degrading ballast condition in accordance an embodiment.

FIG. 8 is a graph 214 showing a response of an electrical characteristic curve 216 plotted over time that is indicative of a degrading ballast condition in accordance with an embodiment. The electrical characteristic curve 216 represents the electrical characteristic progressing over a period of time T. The detection module 126 may measure the electrical characteristic when the rail vehicle 112 is not detected (e.g., there is no rail vehicle approaching or in the crossing intersection 104). For example, data may be collected during intervals when no rail vehicles 112 are present. The data may be collected over an extended time and may be have one or more statistical measure applied (e.g., average, mean, standard deviation).

When no failure modes are detected, the electrical characteristic curve 216 remains substantially constant, as indicated by region 218. The failure prediction module 130 may identify the change in the electrical characteristic curve 216 over time, as indicated by the increasing electrical characteristic response in the increasing region 220. Similarly, the electrical characteristic response may decrease over time (not shown). The failure prediction module 130 may include an upper threshold 222 and a lower threshold 224. The failure prediction module 130 may indicate a failure mode if the electrical characteristic curve 216 exceeds the upper threshold 222 or falls below the lower threshold 224. The predetermined thresholds 222 and 224 may be reprogrammable and may be stored in the memory 128.

When the electrical characteristic curve 216 exceeds the upper threshold 222 or falls below the lower threshold 224, the failure prediction module 130 may identify the failure condition as a degrading ballast condition. For example, loss of ballast 114 material may affect the electrical impedance between the rails 110*a* and 110*b*. Additionally, rain, salt, pot ash, and/or the like may also influence the electrical impedance between the rails 110*a* and 110*b*. The change in the electrical characteristic curve 216 may indicate a loss of sensitivity in determining when the rail vehicle 112 is approaching the crossing intersection. The failure prediction module 130 may send instructions to the maintenance center 136 to remedy the failure mode (e.g., perform maintenance operations on ballast 114 material. The crossing warning system 100 may then be inspected and/or recalibrated.

In various embodiments, the systems described herein may include a plurality of crossing warning systems 100 that may be geographically distributed along several routes. For example, the crossing warning system 100 may include a third route having a second crossing intersection and a second crossing controller. The crossing warning system 100 may include one or more maintenance centers communicably coupled to one or more crossing controllers. The maintenance centers may be configured to determine aggregate analytics based on operational and/or failure mode information received from the crossing controllers. For example, the maintenance centers may compare the operation of a particular crossing controller, and, therefore, the performance of one crossing intersection, to the general population of crossing controllers. Optionally, the maintenance centers may compare the operation of crossing having similar configurations to determine potentially poorer performing crossings. For example, crossing configurations may include hardware, software, environmental and weather conditions, types and frequency of rail traffic, or maintenance activities (or the lack thereof) associated with a crossing and/or a crossing controller. Optionally, the maintenance centers may rank the performance or ordering of the crossings. For example, the maintenance centers may rank the crossing based on the timeframe of the next predicted failure.

The maintenance centers may schedule the maintenance of a particular crossing based on the operational and/or failure mode information received from the crossing. For example, a crossing with a predicted failure may not be time critical and may be delayed until the next schedule maintenance cycle. Alternatively, the predicted failure mode may be imminent, in which case, a special immediate trip may be required. Additionally or optionally, scheduled maintenance may be performed at other crossing locations during the special immediate trip based on the operational and/or failure mode information received from the other crossing locations. The remedial actions to be taken by a maintainer may include maintenance steps based upon the comparison and analysis by the maintenance center. For example, the maintenance center may determine that an individual crossing is experiencing a greater than average occurrence of a degrading ballast condition. The maintenance center may then adjust the remedial actions based on the determination. For example, the remedial action may include regarding the track bed based on the greater than average occurrence of the degraded ballast condition.

Figure 9:
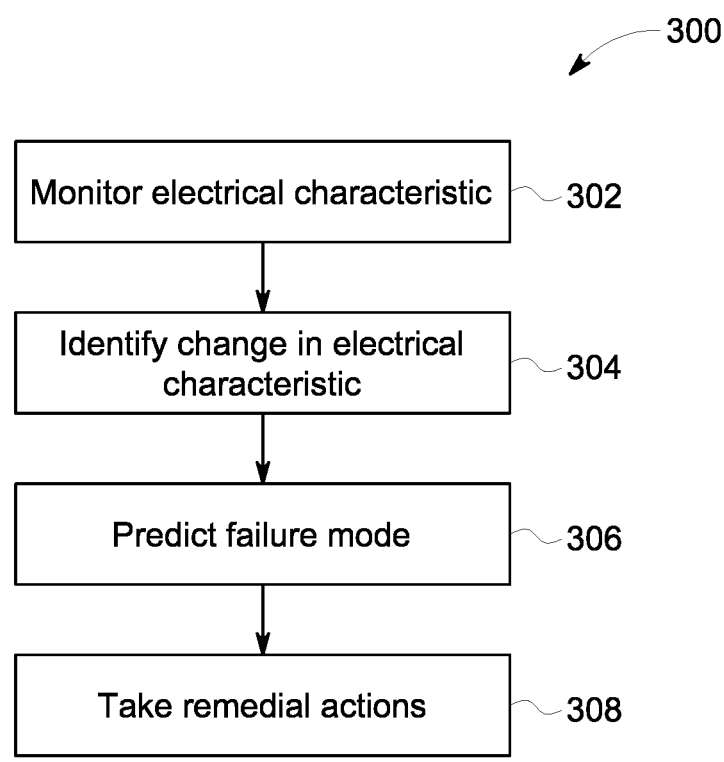
FIG. 9 is a flowchart of an embodiment of a method for predicting failure of a crossing warning system.

FIG. 9 is a flowchart of an embodiment of a method 300 for predicting failure of the crossing warning system 100. The method 300 may be performed, for example, using certain components, equipment, structures, or other aspects of embodiments discussed above. In certain embodiments, certain steps may be added or omitted, certain steps may be performed simultaneously or concurrently with other steps, certain steps may be performed in different order, and certain steps may be performed more than once, for example, in an iterative fashion.

At 302, an electrical characteristic is monitored of a first route when the electrical characteristic is injected into the first route. The first route has a crossing intersection with a second route and a crossing signal near the crossing intersection on the first route. The electrical characteristic is also monitored to detect when a vehicle is approaching the crossing intersection on the first route and to determine when to activate the crossing signal at the crossing intersection. The electrical characteristic of the first route that is monitored may be at least one of an electrical impedance, a phase of the electric current that is injected into the first route, or a combination of the electrical impedance of the route and the phase of the electric current. The first route may include plural conductive rails on which wheels of the vehicle travel and into which the electric current is injected. The electrical characteristic of the first route changes due to the wheels and an axle of the vehicle generating a moving shunt between the conductive rails of the first route. While the electrical characteristic is monitored, the method 300 proceeds to 304.

At 304, one or more changes in the electrical characteristic of the first route are identified. The identification may include a change in at least one of an amplitude or a variance of noise in the electrical characteristic that is monitored. Additionally or optionally, the identification may include identification of a non-linearity in the relationship between the electrical characteristic of the first route and different locations of a moving shunt created by the vehicle along the first route. Additionally or optionally, the identification may include identification of a non-linear and curved relationship between the electrical characteristic of the first route and different locations of the moving shunt created by the vehicle along the first route. Additionally or optionally, the identification may include identification of a location along the first route where a foreign object shunt is located based on where the linear portion of the relationship between the electrical characteristic of the first route and the different locations of the moving shunt created by the vehicle is joined to the non-linear and curved portion of the relationship. After an electrical characteristic is identified, the method 300 proceeds to 306.

At 306, a failure mode of the first route that interferes with the detection of the vehicle approaching the crossing intersection is predicted. Additionally or optionally, the prediction includes a prediction of deterioration of a route-to-wheel interface between the route and one or more of the wheels of the vehicle when at least one of an amplitude or a variance of noise in the electrical characteristic that is monitored is larger when the vehicle is at locations along the first route that are farther from the crossing intersection than when the vehicle is at locations along the first route that are closer to the crossing intersection. Additionally or optionally, the prediction includes a prediction of an inaccurate calibration of a relationship between the electrical characteristic of the first route and different location of a calibration shunt placed at different locations between conductive rails of the first route prior to travel of the vehicle along the first route. Additionally or optionally, the prediction includes a prediction of a foreign object shunt conductively coupling the rails of the first route. Additionally or optionally, the prediction includes a prediction of a failure mode responsive to a relationship between the electrical characteristic of the first route and the different locations of the moving shunt created by the vehicle along the first route having a linear portion joined to a non-linear and curved portion of the relationship. Additionally or optionally, the prediction includes a prediction of a problem with a moving shunt created by wheels and an axle of the vehicle that conductively couples conductive rails of the first route based on the one or more changes in the electrical characteristic of the route. Additionally or optionally, the prediction includes a prediction of a problem with the moving shunt created by the vehicle is predicted responsive to a relationship between the electrical characteristic of the first route and different locations of the moving shunt created by the vehicle having a first curved and non-linear portion for approach of the vehicle to the crossing intersection joined with a second curved and non-linear portion of the relationship for the departure of the vehicle from the crossing intersection. After the failure mode has been predicted, the method 300 proceeds to 308.

At 308, the method 300 takes one or more remedial actions responsive to predicting the failure mode of the first route.

Additionally or optionally, operational and/or failure mode and/or the remedial action taken may be communicated to a maintenance center. The method may collect a plurality of operational and/or failure mode information from a plurality of crossing warning systems. A maintenance center may determine aggregate analytics based on the failure mode information. The method may then compare the operation of one crossing to the general population of crossings. The comparison may include crossings having similar configurations. For example, the configurations may include at least one of, a similar geographic location, environmental and weather conditions, hardware, software, types and frequency of rail traffic, and/or the like. The method may then determine potentially poorer performing crossings or other similar factors. The method may rank the ordering of crossings. Additionally or optionally, the method may schedule maintenance operations based on the failure mode information.

In one example of the inventive subject matter described herein, a method (e.g., for predicting failure of a crossing warning system) includes monitoring an electrical characteristic of a first route when an electric current is injected into the first route. The first route has a crossing intersection with a second route and a crossing signal near the crossing intersection. The electrical characteristic is monitored to detect when a vehicle is approaching the crossing intersection on the first route and to determine when to activate the crossing signal at the crossing intersection. The method also includes identifying one or more changes in the electrical characteristic of the first route, and, based on the one or more changes that are identified, predicting a failure mode of the first route that interferes with detection of the vehicle approaching the crossing intersection.

In one aspect, the electrical characteristic of the first route that is monitored is at least one of an electrical impedance, a phase of the electric current that is injected into the first route, or a combination of the electrical impedance of the route and the phase of the electric current.

In one aspect, the method further comprises taking one or more remedial actions responsive to predicting the failure mode of the first route.

In one aspect, the one or more changes that are identified include changes in at least one of an amplitude or a variance of noise in the electrical characteristic that is monitored.

In one aspect, the first route includes plural conductive rails on which wheels of the vehicle travel and into which the electric current is injected, and the electrical characteristic of the first route changes due to the wheels and an axle of the vehicle generating a moving shunt between the conductive rails of the first route.

In one aspect, the failure mode that is predicted includes a deterioration of a route-to-wheel interface between the route and one or more of the wheels of the vehicle when at least one of an amplitude or a variance of noise in the electrical characteristic that is monitored is larger when the vehicle is at locations along the first route that are farther from the crossing intersection than when the vehicle is at locations along the first route that are closer to the crossing intersection.

In one aspect, the one or more changes that are identified include a non-linearity in the relationship between the electrical characteristic of the first route and different locations of a moving shunt created by the vehicle along the first route.

In one aspect, the failure mode of the first route that is predicted includes an inaccurate calibration of a relationship between the electrical characteristic of the first route and different location of a calibration shunt placed at different locations between conductive rails of the first route prior to travel of the vehicle along the first route.

In one aspect, the inaccurate calibration of the relationship is identified responsive to a non-linear and curved relationship between the electrical characteristic of the first route and the different locations of the moving shunt created by the vehicle along the first route.

In one aspect, the failure mode of the first route that is predicted includes a foreign object shunt conductively coupling the conductive rails of the first route.

In one aspect, the foreign object shunt is predicted as the failure mode responsive to a relationship between the electrical characteristic of the first route and the different locations of the moving shunt created by the vehicle along the first route having a linear portion joined to a non-linear and curved portion of the relationship.

In one aspect, the method further comprises identifying a location along the first route where the foreign object shunt is located based on where the linear portion of the relationship between the electrical characteristic of the first route and the different locations of the moving shunt created by the vehicle is joined to the non-linear and curved portion of the relationship.

In one aspect, the method further comprises predicting a problem with a moving shunt created by wheels and an axle of the vehicle that conductively couples conductive rails of the first route based on the one or more changes in the electrical characteristic of the route.

In one aspect, the problem with the moving shunt created by the vehicle is predicted responsive to a relationship between the electrical characteristic of the first route and different locations of the moving shunt created by the vehicle having a first curved and non-linear portion for approach of the vehicle to the crossing intersection joined with a second curved and non-linear portion of the relationship for the departure of the vehicle from the crossing intersection.

In another example of the inventive subjective matter, a system (e.g., a crossing warning system) comprises a crossing controller. The crossing controller is operably coupled to a crossing signal proximate to a crossing intersection of a first route and a second route. The crossing controller is configured to inject an electric current into the first route. The crossing controller includes a detection module configured to monitor an electrical characteristic of the electric current in the first route to determine when a vehicle is approaching the crossing intersection on the first route and to determine when to activate the crossing signal. The system includes a failure prediction module configured to identify one or more changes in the electrical characteristic of the first route and predict a failure mode that interferes with detection of the vehicle approaching the crossing intersection based on the one or more changes identified in the electrical characteristic.

In another aspect, the electrical characteristic includes at least one of an electrical impedance, a phase of the electric current that is injected into the first route, or a combination of the electrical impedance and the phase of the electric current.

In one aspect, the system further comprises a communication module communicably coupled to the failure prediction module and communicably coupled to a maintenance center to exchange failure mode information between the failure prediction module and the maintenance center, the failure mode information including at least one of the failure mode identified by the failure prediction module, or remedial actions to be taken by the maintenance center in response to the failure mode.

In one aspect, the one or more changes identified by the failure prediction module include changes in at least one of an amplitude or a variance in noise in the electrical characteristic.

In one aspect, the first route includes conductive rails on which wheels of the vehicle travel and into which the electric current is injected, and electrical characteristic of the first route changes due to the wheels and an axle of the vehicle generating a moving shunt between the conductive rails of the first route.

In one aspect, the failure mode predicted by the failure prediction module includes a deterioration of a route-to-wheel interface between the route and one or more wheels of the vehicle when at least one of an amplitude or a variance of noise in the electrical characteristic that is monitored is larger when the vehicle is at locations along the first route that are farther from the crossing intersection than when the vehicle is at locations along the first route that are closer to the crossing intersection.

In one aspect, the one or more changes identified by the failure prediction module include a non-linearity in the relationship between the electrical characteristic of the first route and different locations of a moving shunt created by the vehicle along the first route.

In one aspect, the failure mode predicted by the failure prediction module includes an inaccurate calibration of a relationship between the electrical characteristic of the first route and different location of a calibration shunt placed at different locations between conductive rails of the first route prior to travel of the vehicle along the first route In one aspect, the inaccurate calibration of the relationship is identified responsive to a non-linear and curved relationship between the electrical characteristic of the first route and the different locations of the moving shunt created by the vehicle along the first route.

In one aspect, the failure mode predicted by the failure prediction module includes a foreign object shunt conductively coupling the conductive rails of the first route.

In one aspect, the foreign object shunt is predicted as the failure mode responsive to a relationship between the electrical characteristic of the first route and the different locations of the moving shunt created by the vehicle along the first route having a linear portion joined to a non-linear and curved portion of the relationship.

In one aspect, the system further comprises identifying a location along the first route where the foreign object shunt is located based on where the linear portion of the relationship between the electrical characteristic of the first route and the different locations of the moving shunt created by the vehicle is joined to the non-linear and curved portion of the relationship.

In one aspect, the system further comprises predicting a problem with a moving shunt created by wheels and an axle of the vehicle that conductively couples conductive rails of the first route based on the one or more changes in the electrical characteristic of the route.

In one aspect, the problem with the moving shunt created by the vehicle is predicted responsive to a relationship between the electrical characteristic of the first route and different locations of the moving shunt created by the vehicle having a first curved and non-linear portion for approach of the vehicle to the crossing intersection joined with a second curved and non-linear portion of the relationship for the departure of the vehicle from the crossing intersection.

In one example, a remote communications system for railroad crossings is described. The system monitors key performance indicators (namely RX and Phase) real time and analyzes them to predictively communicate deteriorating conditions before it becomes a larger issue at the crossing (such as a false activation). Some of the issues that can be predicted are those related to rusty rail surfaces, poor shunting of the train, short/conductive paths across the rails, improperly calibrated crossing track circuits, and deteriorating ballast conditions. Electrical characteristics provide performance indicators (e.g., failure modes) having a unique signature under these conditions.

In one example, a system is provided that predicts failures of crossing warning systems prior to a more serious issue occurring. The system may save (e.g., reduce) maintenance and troubleshooting time. The system may reduce the period of time for which a faulty crossing warning device may operate in a state where an accident (e.g., collision) may be more likely to occur.

In one aspect, the electrical characteristic represents an RX term that is a function of the track impedance magnitude measured in ohms and a phase term that is a function of the track impedance phase measured in degrees. An electrical characteristic may be based on the RX and/or phase terms. The electrical characteristic may exhibit noise regions, where no noise is present until a rail vehicle is detected and noise is detected when the rail vehicle is present. The magnitude of the noise lessens as the rail vehicle nears a crossing intersection. The noise may also be present as the rail vehicle departs the crossing intersection. The noise may be indicative of a rusty rail, which may lead to erratic behavior (e.g., false or prolonged signal crossing warning times).

In one aspect, the electrical characteristic may exhibit a non-linear behavior in an approach region and an ideal behavior in an egress region. The non-linear behavior may indicate a track short.

In one aspect, the electrical characteristic may exhibit a non-linear behavior in an approach region and in an egress region. The non-linear behavior may indicate a high value train shunt.

In one aspect, the electrical characteristic may be captured over time when no rail vehicle is present. The rate of change of the electrical characteristic may indicate a poor ballast. If the electrical characteristic exceeds a predetermined threshold, remedial measured may be taken.

In one example, a system is provided, which includes a plurality of crossing warning systems and determines aggregate analytics. The system may compare the operation of one crossing to the general population of crossings or similar or like configurations to determine potentially poorer performing crossings or other similar factors. For example, the configurations may include software and/or hardware configurations, environmental and weather conditions, types and frequency of rail traffic and maintenance activities (or lack thereof). The system may also perform a rank ordering of crossings.

In one aspect, the scheduling of maintenance operations may also optimized such that any required period testing is balanced and scheduled in conjunction with maintenance activities required as a result of a predicted failure mode. For example, the predicted failure mode may not be time critical and may be delayed until the next scheduled periodic testing. Alternatively, the predicted failure mode may be imminent in which case a special immediate trip may be required. Additionally or optionally, scheduled maintenance may be performed during the special immediate trip. Additionally or optionally, scheduled maintenance may be performed during the special immediate trip at other crossing warning systems. A maintainer may also be provided with intelligent maintenance steps ("prescription") based upon the analytics.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the inventive subject matter, they are by no means limiting and are exemplary embodiments. Many other embodiments will be apparent to one of ordinary skill in the art upon reviewing the above description. The scope of the inventive subject matter should, therefore, be determined with reference to the appended clauses, along with the full scope of equivalents to which such clauses are entitled. In the appended clauses, the terms "including" and "in which" are used as the plain-English equivalents of the respective terms "comprising" and "wherein." Moreover, in the following clauses, the terms "first," "second," and "third," etc. are used merely as labels, and are not intended to impose numerical requirements on their objects. Further, the limitations of the following clauses are not written in means-plus-function format and are not intended to be interpreted based on 35 U.S.C. §112, sixth paragraph, unless and until such clause limitations expressly use the phrase "means for" followed by a statement of function void of further structure.

This written description uses examples to disclose several embodiments of the inventive subject matter, and also to enable one of ordinary skill in the art to practice the embodiments of inventive subject matter, including making and using any devices or systems and performing any incorporated methods. The patentable scope of the inventive subject matter is defined by the clauses, and may include other examples that occur to one of ordinary skill in the art. Such other examples are intended to be within the scope of the clauses if they have structural elements that do not differ from the literal language of the clauses, or if they include equivalent structural elements with insubstantial differences from the literal languages of the clauses.

The foregoing description of certain embodiments of the present inventive subject matter will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, controllers or memories) may be implemented in a single piece of hardware (for example, a general purpose signal processor, microcontroller, random access memory, hard disk, and the like). Similarly, the programs may be stand-alone programs, may be incorporated as subroutines in an operating system, may be functions in an installed software package, and the like. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "an embodiment" of the presently described inventive subject matter are not intended to be interpreted as excluding the existence of additional embodiments that also incorporate the recited features. Moreover, unless explicitly stated to the contrary, embodiments "comprising," "comprises," "including," "includes," "having," or "has" an element or a plurality of elements having a particular property may include additional such elements not having that property.

What is claimed is:

1. A method comprising:
monitoring an electrical characteristic of a first route when an electric current is injected into the first route, the first route having a crossing intersection with a second route and a crossing signal at the crossing intersection, the electrical characteristic monitored to detect when a vehicle is approaching the crossing intersection on the first route and to determine when to activate the crossing signal at the crossing intersection;
identifying one or more changes in the electrical characteristic of the first route; and
based on the one or more changes that are identified, predicting a failure mode of the first route that interferes with detection of the vehicle approaching the crossing intersection,
wherein the failure mode of the first route that is predicted includes a foreign object shunt conductively coupling the conductive rails of the first route, and wherein the foreign object shunt is predicted as the failure mode responsive to a relationship between the electrical characteristic of the first route and the different locations of the moving shunt created by the vehicle along the first route having a linear portion joined to a non-linear and curved portion of the relationship.

2. The method of claim 1, wherein the electrical characteristic of the first route that is monitored is at least one of an electrical impedance, a phase of the electric current that is injected into the first route, or a combination of the electrical impedance of the route and the phase of the electric current.

3. The method of claim 1, further comprising taking one or more remedial actions responsive to predicting the failure mode of the first route.

4. The method of claim 1, wherein the one or more changes that are identified include changes in at least one of an amplitude or a variance of noise in the electrical characteristic that is monitored.

5. The method of claim 1, wherein the first route includes plural conductive rails on which wheels of the vehicle travel and into which the electric current is injected, and the electrical characteristic of the first route changes due to the wheels and an axle of the vehicle generating a moving shunt between the conductive rails of the first route.

6. The method of claim 1, wherein the failure mode that is predicted includes a deterioration of a route-to-wheel interface between the first route and one or more of the wheels of the vehicle when at least one of an amplitude or a variance of noise in the electrical characteristic that is monitored is larger when the vehicle is at locations along the first route that are farther from the crossing intersection than when the vehicle is at locations along the first route that are closer to the crossing intersection.

7. The method of claim 1, wherein the one or more changes that are identified include a non-linearity in the relationship between the electrical characteristic of the first route and different locations of a moving shunt created by the vehicle along the first route.

8. The method of claim 1, wherein the failure mode of the first route that is predicted includes an inaccurate calibration of a relationship between the electrical characteristic of the first route and a calibration shunt placed at different locations between conductive rails of the first route prior to travel of the vehicle along the first route.

9. The method of claim 8, wherein the inaccurate calibration of the relationship is identified responsive to a non-linear and curved relationship between the electrical characteristic of the first route and the different locations of the moving shunt created by the vehicle along the first route.

10. The method of claim 1, further comprising identifying a location along the first route where the foreign object shunt is located based on where the linear portion of the relationship between the electrical characteristic of the first route and the different locations of the moving shunt created by the vehicle is joined to the non-linear and curved portion of the relationship.

11. The method of claim 1, further comprising predicting a problem with a moving shunt created by wheels and an axle of the vehicle that conductively couples conductive rails of the first route based on the one or more changes in the electrical characteristic of the first route.

12. The method of claim 11, wherein the problem with the moving shunt created by the vehicle is predicted responsive to a relationship between the electrical characteristic of the first route and different locations of the moving shunt created by the vehicle having a first curved and non-linear portion for approach of the vehicle to the crossing intersection joined with a second curved and non-linear portion of the relationship for the departure of the vehicle from the crossing intersection.

13. A crossing warning system comprising:
a crossing controller operably coupled to a crossing signal located at a crossing intersection of a first route and a second route, the crossing controller comprising:
a detection module configured to inject an electric current into the first route and monitor an electrical characteristic of the electric current in the first route to determine when a vehicle is approaching the crossing intersection on the first route and to determine when to activate the crossing signal; and
a failure prediction module configured to identify one or more changes in the electrical characteristic of the first route and predict a failure mode of the first route that interferes with detection of the vehicle approaching the crossing intersection based on the one or more changes identified in the electrical characteristic,
wherein the failure mode predicted by the failure prediction module includes a foreign object shunt conductively coupling the conductive rails of the first route, and wherein the foreign object shunt is predicted as the failure mode by the failure prediction module responsive to a relationship between the electrical characteristic of the first route and the different locations of the moving shunt created by the vehicle along the first route having a linear portion joined to a non-linear and curved portion of the relationship.

14. The crossing warning system of claim 13, wherein the electrical characteristic includes at least one of an electrical impedance, a phase of the electric current that is injected into the first route, or a combination of the electrical impedance and the phase of the electric current.

15. The crossing warning system of claim 13, further comprising a communication module communicably coupled to the failure prediction module and communicably coupled to a maintenance center to exchange failure mode information between the failure prediction module and the maintenance center, the failure mode information including at least one of the failure mode identified by the failure prediction module, or remedial actions to be taken by the maintenance center in response to the failure mode.

16. The crossing warning system of claim 13, wherein the first route includes conductive rails on which wheels of the vehicle travel and into which the electric current is injected, and electrical characteristic of the first route changes due to the wheels and an axle of the vehicle generating a moving shunt between the conductive rails of the first route.

17. The crossing warning system of claim 13, wherein the one or more changes identified by the failure prediction module include a non-linearity in the relationship between the electrical characteristic of the first route and different locations of a moving shunt created by the vehicle along the first route.

* * * * *